United States Patent [19]

Salvin et al.

[11] Patent Number: 5,501,942
[45] Date of Patent: Mar. 26, 1996

[54] PHOTOSENSITIVE COMPOSITION CONTAINING WATER AS SOLVENT OR DISPERSANT

[75] Inventors: Roger P. Salvin, Weil am Rhein, Germany; Adrian Schulthess, Tentlingen, Switzerland

[73] Assignee: Ciba-Geigy Corporation, Tarrytown, N.Y.

[21] Appl. No.: 304,643

[22] Filed: Sep. 12, 1994

Related U.S. Application Data

[63] Continuation of Ser. No. 990,827, Dec. 14, 1992, abandoned, which is a continuation of Ser. No. 808,385, Dec. 16, 1991, abandoned.

[30] Foreign Application Priority Data

Dec. 18, 1990 [CH] Switzerland ............ 4010/90

[51] Int. Cl.$^6$ ............ C08F 2/50; G03C 1/73; G03F 7/033
[52] U.S. Cl. ............ 430/280.1; 430/281.1; 430/910; 522/84; 522/85
[58] Field of Search ............ 430/280, 281, 430/910; 522/85, 84

[56] References Cited

U.S. PATENT DOCUMENTS

| | | | |
|---|---|---|---|
| 4,592,816 | 6/1986 | Emmons et al. | 204/180.6 |
| 4,621,043 | 11/1986 | Gervay | 430/281 |
| 4,705,740 | 11/1987 | Geissler et al. | 430/288 |
| 4,950,580 | 8/1990 | Hilger | 430/281 |
| 5,045,435 | 9/1991 | Adams et al. | 430/288 |
| 5,153,101 | 10/1992 | Meier et al. | 430/281 |

FOREIGN PATENT DOCUMENTS

| | | |
|---|---|---|
| 0297050 | 12/1988 | European Pat. Off. . |
| 0299591 | 1/1989 | European Pat. Off. . |
| 0546768 | 6/1993 | European Pat. Off. . |
| 8905476 | 6/1989 | WIPO . |

OTHER PUBLICATIONS

Materials Research Labs. Bull. Res. Dev., vol. 2 No. 2 (1988) pp. 13–17, Yeong-Cherng Chiou and Jonq-Min Liu: Emulsified Photoresist for Printed Circuit Imaging.

*Primary Examiner*—Susan W. Berman
*Attorney, Agent, or Firm*—William A. Teoli, Jr.

[57] ABSTRACT

There are disclosed photosensitive compositions based on water as solvent and/or dispersant for the components of said compositions, comprising 10–50% by weight of water-soluble and/or water-dispersible solid, crosslinkable film-forming polymers as binder, 4–50% by weight of water-soluble and/or water-dispersible photopolymerisable acrylate and/or methacrylate monomers and/or corresponding oligomers, 0.1 to 10% by weight of water-soluble and/or water-dispersible photoinitiator compounds for the photopolymerisable acrylate and/or methacrylate monomers and/or corresponding oligomers, and if the binder contains non-selfcrosslinking polymers, 2.5–40% by weight of water-soluble and/or water-dispersible crosslinking agents for the polymeric binder as thermal hardener, selected from the group consisting of epoxy resins, melamine resins and blocked polyisocyanates.

Preferred compositions contain carboxyl group-containing acrylate and methacrylate polymers and copolymers as binder, the carboxyl groups of which composition are reacted with ammonia and/or amines in an amount sufficient to ensure the water-solubility of the polymers and copolymers.

The novel compositions are photoimageable and are particularly suitable for use as solder resists.

14 Claims, No Drawings

PHOTOSENSITIVE COMPOSITION CONTAINING WATER AS SOLVENT OR DISPERSANT

This application is a continuation, of application Ser. No. 07/990,827, filed Dec. 14, 1992, now abandoned, which is a continuation of application Ser. No. 07/808,385 filed Dec. 16, 1991, now abandoned.

The present invention relates to a photosensitive composition, to a process for the preparation thereof, to a process for producing a coating with the aid of said composition and to a preferred use of said composition.

Photosensitive compositions and their use as photoresists, inter alia for the preparation of solder masks, have long been known in the art. Such compositions are disclosed in EP-B 0 115 354. They contain a polymeric binder which has free carboxyl groups, typically a suitable polyacrylate, radically polymerisable monomers such as (meth)acrylates, photoinitiators for polymerising them, for example benzophenone, and optionally a hardener, such as a melamine, with which the binder can be thermally crosslinked after exposure and development. Although the free carboxyl groups of the binder make it possible to develop coatings of these compositions with aqueous-alkaline solutions, for example with 1% $Na_2CO_3$ solution, after exposure, the binders are normally insoluble in water. It is therefore necessary to apply the compositions as a solution in an organic solvent, for example in methylene chloride/methanol, and often also in methoxypropyl acetate or butyl glycol acetate. The use of an organic solvent is undesirable for environmental reasons and also necessitates the use of apparatus which is protected against the risk of explosion.

Photosensitive compositions which avoid the use of organic solvents for application and which are used, inter alia, as solder resists, have already been described in the art. Thus PCT international application WO 89/05476 relates to the use of such a photosensitive composition containing a flowable binder which is soluble in aqueous or aqueous-alkaline solutions. As the compositions are thereby themselves liquid, the use of a solvent for application is unnecessary, but other material problems arise. Thus the use of an additional hardener is necessary which, upon mild heating, results in crosslinking and hence to the hardening of a coating of the composition on a substrate. The crosslinking may, however, only proceed to such a degree that the coating remains capable of development with aqueous or aqueous-alkaline solutions. According to the teaching of this application, epoxy resins are used for this crosslinking. It is pointed out, however, that these resins are so reactive that crosslinking occurs already during storage, so that the use of the compositions in the form of two-pan systems is recommended. A further shortcoming of the cited compositions is their rather high viscosity, which makes them unsuitable for many applications, as the amount to be applied cannot be controlled with sufficient accuracy. The viscous formulations are, moreover, difficult to degas, so that bubbles may form in the coating and, owing to the customary low layer thicknesses, even holes can occur therein.

Another proposal for avoiding the use of organic solvents for applying photosensitive compositions similar to the above-described type is disclosed in U.S. Pat. No. 4,592,816. According to the teaching of this patent, it is possible to react a polymer which contains free carboxyl groups with sodium hydroxide and thereby to convert it into a water-soluble form for application with an acrylate monomer and a photoinitiator in aqueous solution. Application is made by means of electrophoretic deposition (anaphoresis) to obtain a coating which can be developed in an aqueous-alkaline solution. The coating obtained according to this U.S. patent is used, inter alia, as a solder mask and it is mentioned that, in addition to electrophoretic deposition, conventional methods are also possible to produce a film of the disclosed compositions on the substrates. However, problems arise when using such conventional methods. In this case, for example, the carboxylic acid salt radicals naturally remain in the coating, whereas an anaphoresis leads to the reformation of the free polycarboxylic acids. However, the carboxylic acid salt radicals increase the electrical conductivity of the coating. An essential property of a solder mask, namely to act as insulator between the conductors, is therefore no longer available to a sufficient extent. In addition, corrosion may easily occcur. The method of electrophoretic deposition is, on the other hand, only applicable for mixtures containing few components when the object is to obtain homogeneous coatings. It is hardly possible to effect that all components of a solution will diffuse in a solution equally rapidly and in the same direction in the electric field.

In the paper "Emulsified Photoresist for Printed Circuit Imaging" by Yeong-Cherng Chiou und Jonq-Min Liu (Materials Research Laboratories Bull. Res. Dev., Vol. 2, No. 2 (1988) pp. 13–17), there is described a water-based photosensitive composition which contains as binder an aqueous-emulsified copolymer of acrylates, styrene, methacrylic and acrylic acid, in addition to photopolymerisable (meth)acrylate monomers and suitable photoinitiators therefor. This composition is especially suitable for making dry resists which can be developed with alkaline solutions and it does not contain a thermal hardener.

The present invention relates to a photosensitive composition which contains water as solvent and/or dispersant for the components thereof and which comprises at least the following components in the indicated amounts:

10–50% by weight of water-soluble and/or water-dispersible solid, crosslinkable film-forming polymers as binder, 4–50% by weight of water-soluble and/or water-dispersible photopolymerisable acrylate and/or methacrylate monomers and/or corresponding oligomers, 0.1 to 10% by weight of water-soluble and/or water-dispersible photoinitiator compounds for the photopolymerisable acrylate and/or methacrylate monomers and/or corresponding oligomers, and if the binder contains non-selfcrosslinking polymers, 2.5–40% by weight of water-soluble and/or water-dispersible crosslinking agents as thermal hardener for the polymeric binder, selected from the group consisting of epoxy resins, melamine resins and blocked polyisocyanates.

Preferred compositions comprise the cited components in the following amounts: 10–25% by weight of water-soluble and/or water-dispersible solid, crosslinkable film-forming polymers as binder, 4–15% by weight of water-soluble and/or water-dispersible photopolymerisable acrylate and/or methacrylate monomers and/or corresponding oligomers, 0.1 to 5% by weight of water-soluble and/or water-dispersible photoinitiator compounds for the photopolymerisable acrylate and/or methacrylate monomers and/or corresponding oligomers and, if the binder contains non-selfcrosslinking polymers, 2.5–10% by weight of water-soluble and/or water-dispersible crosslinking agents as thermal hardener for the polymeric binder, selected from the group consisting of epoxy resins, melamine resins and blocked polyisocyanates.

It is especially preferred that the compositions of the invention contain only crosslinking agents of one of the indicated types, most preferably only a single crosslinking agent.

In addition to the aforementioned components, the compositions of this invention can contain further components, as will be set forth in more detail hereinafter. Furthermore, the compositions of this invention additionally contain water as basic sole solvent and/or dispersant. The compositions may, however, also contain minor amounts of organic solvents if components used for the compositions are dissolved in such solvents. Water then constitutes the balance in the inventive compositions to make up 100% by weight. The water content of the compositions is governed substantially by the desired viscosity of the compositions. Preferred compositions contain at least c. 30% by weight of water. The preferred maximum water content is c. 70% by weight.

It is essential that the polymers suitable as binder for the novel compositions are solid, but this restriction need not apply to all other components of the compositions. In this context, the term "solid" shall be understood as meaning that the softening point of the polymers will be at least higher than room temperature. Very suitable binders include polymers whose softening point is above 60° C. A softening point above 80° C. is especially suitable. The use of these solid film-forming polymers as binder makes the aforementioned prior art use of those crosslinking agents redundant which, even at the temperatures required for removing the solvent from the compositions, lead to a crosslinking of the polymers which is at least sufficiently strong that a mechanically stable coating of the photosensitive composition is able to form.

In their most general form, the novel compositions can contain as binder solid, crosslinkable, film-forming polymers which are soluble or dispersible in water or both. In the last-mentioned case, the optional addition of a dispersant may be useful. However, particularly preferred compositions contain only water-soluble polymers as binder.

Particularly suitable binders are polyvinyl alcohol/polyvinyl acetate polymers and copolymers, maleic anhydride/vinyl ether copolymers, maleic anhydride/styrene copolymers and acrylic acid and methacrylic polymers and copolymers, as well as carboxyl group-containing acrylate and methacrylate polymers and copolymers.

When using maleic anhydride/vinyl ether copolymers, maleic anhydride/styrene copolymers and acrylic acid and methacrylic polymers and copolymers, as well as carboxyl group-containing acrylate and methacrylate polymers and copolymers, it is preferred if carboxyl groups (or, as the case may be, anhydride groups) are reacted with ammonia and/or amines in an amount sufficient to ensure the water-solubility of the polymers and copolymers, the amines being chosen such that, at least at the temperatures suitable for the thermal cure of the polymers in the composition, they will substantially volatilise from a film which forms or has formed from said composition.

The cited polymers are known to the skilled person (q.v. for example ULLMANNS ENCYKLOPÄDIE DER TECHNISCHEN CHEMIE (Ullmann's Encyclopedia of Industrial Chemistry), 4th edition, Vol. 19, Verlag Chemie, Weinheim 1980) and some are commercially available. Their molecular weight is in the range from 2000 to 500 000, preferably higher than 10 000.

Suitable maleic anhydride/vinyl ether copolymers may contain vinyl methyl ether as an ether component and are available under the registered trademark Gantrex® AN [GAF CORP.] Suitable maleic anhydride/styrene copolymers are sold under the registered trademark Scripset® resins [MONSANTO]. It is known in the art that polyvinyl alcohol is obtained by more or less strong saponification of polyvinyl acetate and is readily water-soluble. It can be commercially obtained under the registered trademark Mowiol® [HOECHST], and polyvinyl acetate is obtainable under the registered trademak Mowilith® [HOECHST]. The polyvinyl acetate can be copolymerised with anhydrides of dicarboxylic acids, for example maleic anhydride. Copolymers of polyvinyl acetate with crotonic acid are also water-soluble and have good film-forming properties.

By acrylic acid and methacrylic acid polymers and copolymers as well as carboxyl group-containing acrylate and methacrylate polymers and copolymers are meant both the homo- and copolymers of the pure acids as well as the copolymers of the acids with their esters, preferably the alkyl esters, or styrene. Further suitable polymeric binders of this type are cited in EP-A-115 354. Some are also commercially available, for example under the registered trademarks Carboset® [GOODRICH], Joncryl® [JOHNSON] or Surcol® [ALLIED COLLOIDS].

The acid value of the polymers (number of mg of KOH required to neutralise 1 g of polymer), which also characterises the number of free carboxyl groups, should be at least 25 before the reaction with the ammonia or the amines in order to ensure good properties of the composition with respect to water-solubility and that it is capable of development in aqueous-alkaline solutions. Still better, and therefore preferred, are acid values above 60.

The reaction of the carboxyl groups with the ammonia or the amines is a neutralisation reaction to form corresponding ammonium or aminium carboxylates. These relatively ionic carboxylate groups cause the polymeric binders to dissolve readily in water. When such a composition is subjected to a heat treatment, such as drying a coating of the composition or the thermal cure of such compositions, it can happen that the ammonium or aminium carboxylate groups decompose again and the bases volatalise. A coating which contains free carboxyl groups is the result of good solubility in aqueous-alkaline solutions.

The polymers used as binders must be crosslinkable. They may therefore on the one hand be self-crosslinking polymers. It is common knowledge that these polymers contain structural units which undergo a crosslinking reaction solely under the influence of heat or also actinic radiation and without the addition of special substances as hardeners. Typical examples are (meth)acrylate copolymers which have been prepared using (meth)acrylamide monomers, such as $CH_2$=CH—COONH—$CH_2$OR, and which are crosslinkable under the influence of heat. Exemplary of a commercially available self-crosslinkable acrylic resin is Carboset® 531 [GOODRICH].

If, on the other hand, the polymers of the binder are not self-crosslinking types, then the compositions of this invention will contain as further component a water-soluble or water-dispersible crosslinking agent as hardener, namely one selected from the group consisting of epoxy resins, melamine resins and blocked polyisocyanates. Less preferred, but in principle also possible, is the use of mixtures of the cited crosslinking agents.

Suitable crosslinking agents are conventional epoxy resins, typically derived from bisphenols such as bisphenol A, novolaks, hydantoins, uracils and isocyanurates. These compounds can be monomers as well as prereacted adducts with polyamines, polycarboxylic acids, polyalcohols or polyphenols and the like. Suitable epoxy resins are available as a wide range of commercial types, for example under such registered trademarks as Araldite® [CIBA-GEIGY], DEN® [DOW] and others. A particularly preferred composition contains an epoxy resin, for example a novolak-based epoxy resin, as sole thermal hardener.

Compositions of this invention can also contain a melamine resin as thermal hardener, preferably as sole thermal hardener. Preferred melamine resins are condensates of melamine and formaldehyde. These melamine resins are able to effect a three-dimensional crosslinkage by reaction with hydroxyl groups of the polymers of the binder. Melamine resins suitable for use in the practice of this invention are also commercially available, for example under the registered trademark Cymel®.

Blocked polyisocyanates suitable for use in the practice of this invention may be derived typically from aliphatic, cycloaliphatic, aromatic or araliphatic compounds containing at least two isocyanate groups. Such compounds include 2,4-diisocyanatotoluene and the technical mixtures thereof with 2,6-diisocyanatotoluene, 2,6-diisocyanatotoluene, 4,4'-diisocyanatodiphenylmethane as well as industrial mixtures of different diisocyanatodiphenylmethanes (for example the 4,4'- and the 2,4'-isomers), N,N'-bis(4-methyl-3-isocyanatophenyl)urea 1,6-diisocyanatohexane and the like. They can be capped with different radicals. Exemplary of suitable capping components are β-dicarbonyl compounds such as malonates, acetoacetates or 2,4-pentandione, or hydroxamates, triazoles, imidazoles, imidazolides, tetrahydropyrimidines, lactams, oximes, hydroxyimides such as N-succinimide, or phenols and thiophenols. Also suitable are urethanised, carbodiimidised or di- and trimefised polyisocyanates, for example urethanised 4,4'-diisocyanatodiphenylmethane, carbodiimidised 4,4'-diisocyanatodiphenylmethane, the uretdione of 2,4-diisocyanatotoluene or the trimerisate of diisocyanatotoluene. The deblocking temperature of the capped polyisocyanates is conveniently in the range from 90° to 160° C., preferably from 110° to 140° C. Polyisocyanates suitable for use in the practice of this invention are also commercially available, for example under the registered trademark Desmodur® [BAYER].

Inventive compositions which contain in particular a blocked polyisocyanate as sole thermal hardener also constitute a preferred embodiment of the invention.

Customary initiators of radical photopolymerisation can be used as photoinitiators. If desired, additional co-initiators can be used. In principal, the initiators may also be used in amounts greater than 10% by weight, but without leading to better results. Suitable examples of photoinitiator systems are aromatic carbonyl compounds such as benzoin, benzoin alkyl ethers, such as the isopropyl or n-butyl ether, α-substituted acetophenones, preferably benzil ketals, such as benzil dimethyl ketal, or α-halogen-substituted acetophenones, such as trichloromethyl-p-tert-butyl phenyl ketone or morpholinomethyl phenyl ketone, or dialkoxyacetophenones, such as diethoxyacetophenone, or α-hydroxyacetophenones, such as 1-hydroxycyclohexyl phenyl ketone; or benzophenones, such as benzophenone or bis(4-dimethylamino)benzophenone; or metallocene initiators, such as titanocene initiators, for example bis(π-methylcyclopentadienyl)bis(σ-pentafluorophenyl)titanium (IV); or a stannan in conjunction with a photoreducable dye, for example trimethylbenzylstannan in conjunction with methylene blue or Bengal pink; or a quinone or a thioxanthone in conjunction with an amine which carries at least one hydrogen atom at an α-carbon atom, such as anthraquinone, benzoquinone or thioxanthone in conjunction with bis(4-dimethylamino)benzophenone or triethanolamine; or a thioxanthone, for example an alkyl- or halogen-substituted thioxanthone, such as 2-isopropylthioxanthone or 2-chlorothioxanthone; or acyl phosphides.

Suitable photopolymerisable acrylate and methacrylate monomers and oligomers are also known to the skilled person and described in EP-A-115 354, which is cited here by way of reference. Very suitable for the purposes of this invention are diethylene glycol diacrylate, trimethylolpropane triacrylate, pentaerythritol triacrylate or epoxy acrylates, bisphenol A, phenol or cresol novolaks, urethane acrylates or polyester acrylates. The epoxy acrylates can be modified in conventional manner with a carboxylic anhydide.

It will be readily understood that the novel compositions, in addition to the components already cited, may contain further components such as water-soluble dyes and/or water-dispersible pigments, for example in an amount of 0.1 to 1% by weight, or also other additives customarily used for aqueous coating compositions, normally in amounts from 0.5 to 5% by weight, such as antifoams, adhesion promoters, fungicides or thixotropic agents.

In some cases it may also be useful to add water-compatible fillers to the compositions, including talc, barium sulfate or quartz, with which the properties of a coating, such as its heat resistance or insulating resistance to electric currents, can be enhanced or its tackiness reduced. The invention therefore also relates to a special form of the novel compositions, which additionally comprises 10 to 35% by weight of water-compatible fillers.

Particularly preferred compositions are those in which the polymers acting as binder are acrylic acid and/or methacrylic acid polymers and copolymers and/or carboxyl group-containing acrylate and/or methacrylate polymers and copolymers, the carboxy groups of which are reacted with ammonia and/or amines to an extent sufficient to ensure the water-solubility of the polymers and copolymers, the amines being chosen such that, at least at temperatures which are suitable for the thermal cure of the polymers in the composition, they will substantially volatilise from a film which forms and/or has formed from the composition.

Ammonia is one of the particularly preferred neutralising agents for the reaction with the carboxyl groups of the polymers of the binder, especially of the last mentioned type. It has a relatively high vapour pressure even at low temperature and can volatilise readily from a film which has formed from a composition of this invention. It will usually have volatilised completely from the coating after the drying step which is necessary to remove water from the applied composition. Consequently the invention also relates to a photosensitive composition containing a binder comprising maleic anhydride/vinyl ether copolymers, maleic anhydride/styrene copolymers and, preferably, acrylic acid and/or methacrylic acid polymers and copolymers and/or carboxyl group-containing acrylate and methacrylate polymers and copolymers as described above, the carboxyl groups of which composition are reacted with ammonia.

A great number of amines are also suitable for the reaction of the carboxyl groups of the cited polymers. All types of amines are suitable, such as primary, secondary and tertiary amines, as well as heterocycles containing amino nitrogen. The choice of amines is solely restricted by the feature that the carboxyl group-containing polymers reacted with the amines shall be water-soluble. For this reason, the organic radicals attached to the amino nitrogen should preferably contain only relatively few carbon atoms. It is preferred that the organic radicals of the amines contain substituents which promote solubility in water, typically hydroxyl groups. Examples of suitable amines are lower alkylamines such as monomethylamine, dimethylamine and trimethylamine, corresponding pure ethylamines, propylamines and butylamines as well as the mixed amines which contain the cited radicals. Very suitable types of amine are also alkanolamines such as ethanolamine, dimethylethanolamine, diethanolamine, triethanolamine, or 2-amino-2-methyl-1,3-propanediol. Aromatic amines such as aniline may also suitably be used. Morpholine may be mentioned as a typical example of a heterocycle which contains amino nitrogen.

The amines suitable for use in the practice of this invention can be divided into two groups on the basis of their volatility and their boiling point. The first group comprises amines which, compared with water, are comparatively volatile, for example those which, at the same temperature, have a lower evaporation number and a higher vapour pressure than water. In general, the amines of this type will have boiling points below about 80° C. The second group comprises amines which are less volatile than water and will generally have boiling points above 100° C. Exemplary of such amines are dimethylethanolamine, diethanolamine, triethanolamine or 2-amino-2-methyl-1,3-propanediol.

Drying applied compositions based on amines of the first group, i.e. the formation of a film of such a composition, can be effected at temperatures at which the resultant aminium carboxylate groups of the polymers of the binder decompose again and the free amine substantially volatilises from the dried composition, as described above in connection with ammonia. Owing to the reformed free carboxyl groups of the binder, these compositions are soluble in aqueous alkaline solutions. Acccordingly, special compositions of this invention are those described above, the carboxyl groups of which are reacted with amines that are chosen such that they will substantially volatilise again from the photosensitive composition at least at the temperature which is applied to form a film of the photosensitive composition from the photopolymer solution.

On the other hand, the aminium carboxylate groups of the binder of those novel compositions which are based on less volatile amines also decompose at the temperatures expedient for drying the compositions at most to a minor extent. Owing to the large number of ionic or strongly polar aminium carboxylate radicals which are therefore still present in such films, these films are soluble in water. This water-solubility can often be advantageous. The invention therefore also relates to compositions of the kind described above in which the carboxyl groups are reacted with amines which are chosen such that they will substantially volatilise again from the photosensitive composition at a temperature that is above the temperature which is applied to form a film of the photosensitive composition from the polymer solution.

It will, of course, be appreciated that it would also be possible to obtain water-soluble films of compositions based on ammonia or the relatively volatile amines of the first group if suitably mild drying methods were used in which aminium carboxylate radicals cannot decompose.

The process described hereinbelow has proved especially useful for preparing compositions of this invention and hence likewise constitutes an object of the invention. In this process, if necessary first the acrylate and/or methacrylate monomers and/or oligomers are convened by heat into a flowable state and the photoinitiators are dissolved therein. If appropriate, co-initiators may also be added. With stirring, the polymers of the binder are then added to the solution in the form of an aqueous solution or dispersion.

Further aqueous solutions or dispersions of other desired components may afterwards be added, as appropriate.

The compositions of this invention are especially suitable for the production of coatings on substrates of all kinds, for example wood, textiles, paper, ceramics, glass, synthetic resins such as polyesters, polyolefins, cellulose acetate or epoxy resins, preferably glass fibre-reinforced epoxy resins, as well as metals such as Al, Cu, Ni, Fe, Zn, Mg or Co, and semi-conductor materials such as Si, GaAs or Ge, and insulator materials, such as $Si_3N_4$ or $SiO_2$, onto which an image or, in particular, a protective layer, shall be applied by irradiation.

The invention therefore also relates to the production of a coating, which comprises the steps of:
applying a photosensitive composition as described hereinabove to a substrate,
removing water from the applied composition to form a film of the photosensitive composition on the substrate,
exposing the coated substrate to radiation with actinic light in a desired pattern, removing the unexposed areas of said coating with an aqueous or aqueous-alkaline solution to uncover the substrate, and
subjecting the coating remaining on the substrate to a thermal cure and to an optional UV cure.

The coated substrates can be prepared by coating techniques which are known in the art and with which a coating can be uniformly applied. Exemplary of such coasting techniques are spin-coating, brushing, spraying, for example electrostatic spraying, reverse roller coating, dip coating and doctor knife application, and curtain coating. The compositions of this invention are particularly suitable for curtain coating.

The add-on (layer thickness) and the nature of the substrate (support) depend on the desired field of application. The compositions of the invention can be applied in relatively thin layers and give good resolution. Using a suitably chosen source of radiation they are suitable for all fields of use in which it is desired to produce structured images.

The coatings of this invention also have excellent thermal resistance when they are brought into contact with hot liquid metals or alloys, for example with a solder bath which will normally have a temperature in the range of about 270° C. The invention therefore further relates to this use of the inventive coatings and also to the use of the described compositions as photoimageable solder resists for the production of printed circuit boards, which utility is especially preferred.

After coating, the water present in the compositions will normally be removed by drying to give an amorphous layer of the resist on the substrate, the thickness of which layer is preferably 5–150 µm after drying. The drying temperatures are normally below the temperature at which the thermal crosslinking of the binder in the coating takes place, preferably below 100° C., for example at 70°–80° C. If desired, drying may also be carried out under vacuum, in which case the water naturally does not need to be removed by heat and drying can be effected solely by applying a vacuum.

As has already been explained above, when using maleic anhydride/vinyl ether copolymers, maleic anhydride/styrene copolymers and acrylic acid and/or methacrylic acid polymers and copolymers and/or carboxyl group-containing acrylate and methacrylate polymers and copolymers as binders, then depending on the type of agent used for neutralising the free carboxyl groups of the polymer, the ammonium or aminium carboxylate groups decompose during the drying step and the ammonia or amine is able to diffuse from the coating and volatilise. Depending on the behaviour of the neutralising agent, a different kind of layer is obtained. If the aminium carboxylate groups decompose, the layer is soluble in aqueous alkalies but not in water, if they do not decompose, then the coatings can be dissolved even in pure water.

The photosensitive layer is thereafter exposed to radiation in known manner in order to photopolymerise the acrylate and/or methacrylate monomers and/or oligomers. Exposure is normally made imagewise. The photopolymerisation of these components causes a diminution of solubility at the exposed areas compared with the unexposed areas, so that a differentiation of the surface is possible.

The compositions of the invention are exposed to radiation with actinic light, normally by UV and/or VIS radiation, preferably in the wavelengfth range of 220–550 nm, more particularly of 220–450 nm. All known sources of radiation can be used for exposure, including mercury high-pressure lamps or UV/VIS lasers. The prcess parameters, such as duration of exposure and distance between the source of radiation and the photosensitive layer, will usually depend on the type of photosensitive composition and on the desired properties of the coating, and can be determined by the skilled person by making a few routine experiments. The imagewise exposure can be made through a photomask or by writing direct with a laser beam onto the photosensitive layer.

Development is effected following exposure. The unexposed areas of the photoresist can be removed by treatment with a developer solution. Particularly suitable developers for layers obtained in the practice of this invention are aqueous solutions which, when using (meth)acrylate binders, must be alkaline if many free carboxyl groups have formed again in the coating during drying. However, it would also be possible to use organic solvent-based developers, typically butyl diglycol. As development generally takes place in a closed tank, the danger of solvent emissions is only insignificant.

After exposure and development, the coating is subjected to a thermal aftertreatment or cure. This is done by heating to a temperature at which the crosslinking of the polymers of the binder takes place. The required temperature is normally above 100° C., typically in the range from 120°–150° C. In some cases it may also be expedient to effect an additional cure with UV radiation which can lead to an even more complete polymerization of (meth)acrylate monomers and/or oligomers. This additional cure can be effected simultaneously with the thermal cure.

The invention finally also relates to two special embodiments of the above described process using photosensitive compositions based on maleic anhydride/vinyl ether copolymers, maleic anhydride/styrene copolymers and, preferably, on acrylic acid and/or methacrylic acid polymers and copolymers and/or carboxyl group-containing acrylate and methacrylate polymers and copolymers, the carboxyl groups of which compositions are reacted with amines.

In the first special embodiment of the process, a photosensitive composition which has been prepared using ammonia or an amine which is more volatile than water is applied to the substrate. The formation of the film of the photosensitive composition is effected by heating to a temperature at which the ammonia and/or the amine substantially volatilises, and the unexposed areas of the coating am removed with the aid of an aqueous-alkaline solution. Suitable for this purpose are alkali metal carbonate developers or lower alkylammonium hydroxide solutions, so-called metal-free developers, in a concentration of typically 1%.

In the second special embodiment of the process, a photosensitive composition which has been prepared using an amine which is less volatile than water, as explained in more detail above, is applied to the substrate. Removal of the unexposed areas of the coating is effected with water, and the cure is then carried out at a temperature which is sufficiently high to cause substantial volatilisation of the amine.

Surprisingly, it has also been found that coatings of inventive compositions on many substrates, including conventional printed circuit board laminates, are of especially good quality if the substrate has been slightly moistened beforehand with water, for example with a sponge or technically with the aid of a rubber roll. In this manner it is possible to obtain a particularly uniform application and an extremely low tendency to form bubbles. A particularly advantageous embodiment of the above described process for producing a coating therefore comprises moistening the substrate prior to the application of the coating.

In the following illustrative Examples percentages are by weight.

Example 1

A photosensitive and photoimageable composition is prepared by mixing the following components:

(Irgacure® 907=2-methyl-1-[4-(methylthio)phenyl]-2-morpholinopropan-1-one, and Byk® antifoam [BYK-MALLINCKRODT], are products based on mineral oils with additives such as alcohols, metal soaps or emulsifiers).

| | |
|---|---|
| Carboset ® 525 binder (polyacrylic acid resin, reacted with ammonia and dissolved in water) | 14% |
| trimethylolpropane triacrylate | 11% |
| Irgacure ® 907 | 1% |
| 4,4-bis(diethylamino)benzophenone | 0.11% |
| micronised (particle size <5 μm) triglycidyl isocyanurate PT810 ®, dispersed in the binder | 4% |
| water | 60% |
| Microlith ® Blue pigment | 0.1% |
| Byk 035 ® antifoam | 0.04% |
| micronised talc (particle size <5 μm) | 9.75% |

The photoinitiator is dissolved in the trimethylolpropane triacrylate monomer and emulsified into the aqueous solution of the binder. The other components are added afterwards, with stirring. Under yellow light, a solution of this composition is applied to a cleansed printed circuit board. The solution is air dried for 10 min and for a further 30 min at 80° C. Exposure is then made through a photomask for 20 s using a 5000 W metal halide mercury vapor lamp. Development with a 1% solution of sodium carbonate is then carried out such that the unexposed pans of the coating dissolve, and the developed printed circuit board is heated for 1 hour to a temperature of 140° C in order to effect a postcure of the coating.

The fluxed printed circuit board is dipped for 10 s in a hot solvent bath of 270° C. Fully soldered solder points are obtained, and no damage occurs either on the laminate layer nor on the copper layer of the printed circuit board.

The following compositions are processed as described in Example 1, unless otherwise indicated:

Example 2

The following composition is used:

| | |
|---|---|
| Carboset ® XL 37 binder (polyacrylic acid resin; reacted with ammonia and dissolved in water) | 14% |
| Chemlink ® 3000 epoxy acrylate | 8% |
| diethylene glycol diacrylate | 3% |
| Irgacure ® 907 | 1% |
| 4,4-bis(diethylamino)benzophenone | 0.11% |

| | |
|---|---|
| micronised blocked isocyanurate | 8% |
| Desmodur ® AP Stabil, dispersed in the binder | |
| water | 60% |
| Microlith ® Blue pigment | 0.1% |
| Byk 80 ® antifoam | 0.04% |
| talc | 9.75% |
| adhesion promoter (triazole derivative) | 0.1% |

No corrosion occurs after storage for 7 days in a conditioning chamber (temperature 60° C., humidity 92%) under a voltage of 100 v.

Example 3

A composition as described in Example 1 is used, except that the binder is reacted with diethanolamine. After exposure, development can be made with water.

Example 4

The following composition is used:

| | |
|---|---|
| Carboset ® 1387 (polyacrylic acid/styrene copolymer, reacted with ammonia and dissolved in water | 13% |
| pentaerythritol triacrylate | 11% |
| Irgacure ® 907 | 1% |
| 4,4-bis(diethylamino)benzophenone | 0.11% |
| Cymel ® 300 melamine resin | 8% |
| paratoluenesulfonic acid, neutralised with | 0.25% |
| ammonia water | 60% |
| Microlith ® Blue pigment | 0.1% |
| Byk 035 ® antifoam | 0.04% |
| talc | 5.5% |

The printed circuit board resists a hot solder bath without the occurrence of defects.

Example 5

The following composition is used:

| | |
|---|---|
| Carboset ® 531 (polyacrylic acid binder, reacted with ammonia and dissolved in water) | 14% |
| pentaerythritol triacrylate | 11% |
| Irgacure ® 907 | 1.1% |
| 4,4-bis(diethylamino)benzophenone | 0.11% |
| micronised phenol-capped isocyanate, Desmodur ® AP Stabil | 8% |
| water | 60% |
| Microlith ® Blue pigment | 0.1% |
| Byk 035 ® antifoam | 0.1% |
| talc | 5.29% |
| Bentone ® LD-2 (thixotropic agent) | 0.8% |
| adhesion promoter (triazole derivatives) | 0.5% |

In contradistinction to Example 1, the printed circuit board is curtain-coated and dried in a circulating air oven. The board is non-tacky after drying. Exposure, development and postcure are carried out as described in Example 1. The adhesion of the coating to the copper and the laminate of the printed circuit board in accordance with DIN 53 151 is good before and after boiling for 1 hour in water (GtO).

Example 6

The following composition is used:

| | |
|---|---|
| Carboset ® 531 (polyacrylic acid binder, reacted with ammonia and dissolved in water) | 12% |
| CRAYNOR CN 112 C60 ® (acrylated epoxy phenol- | 16.4% |
| novolak, 60% in trimethylolpropanetriacrylate) | |
| Irgacure ® 907 | 1.3% |
| 4,4-bis(diethylamino)benzophenone | 0.1% |
| micronised oxime-capped isocyanate | 3% |
| IPDI 1358 B-100 (deblocking at c. 120° C.) | |
| water | 60% |
| Microlith ® Blue pigment | 0.06% |
| Microlith ® Yellow pigment | 0.04% |
| Byk 035 ® antifoam | 0.1% |
| talc | 7% |

Processing is as described in Example 1, except that after the development step the printed circuit board is subjected to a post-exposure (3000 mJ/cm$^2$) for complete crosslinking of the acrylate groups and subsequently cured for 1 hour at 140° C. No defects are observed after a subsequent solder bath test.

Example 7

The following composition is used:

| | |
|---|---|
| Carboset ® 531 (polyacrylic acid binder, | 4.2% |
| (reacted with ammonia and dissolved in water) | |
| Quatrex ® 2410 solid epoxy novolak, acrylated, reacted with succinic anhydride (softening point: c. 80° C., epoxide eq. wt.: c. 190, 1 acid eq. per kg), neutralised with ammonia and dissolved in water | 14.7% |
| trimethylolpropanetriacrylate | 6.2% |
| Irgacure ® 907 | 1.5% |
| 4,4-bis(diethylamino)benzophenone | 0.2% |
| micronised oxime-capped isocyanate | 2.8% |
| IPDI 1358 B-100 (deblocking at c. 120° C.) | |
| water | 58% |
| Microlith ® Blue pigment | 0.06% |
| Microlith ® Yellow pigment | 0.04% |
| Byk 035 ® antifoam | 0.1% |
| talc | 12.2% |

Processing is carried out as described in Example 6. No defects occur after a subsequent solder bath test.

Example 8

The following composition is used:

| | |
|---|---|
| Carboset ® 531 (polyacrylic acid binder, | 5.7% |
| (reacted with ammonia and dissolved in water) | |
| ECN 1299 solid epoxy novolak, acrylated, reacted with succinic anhydride (1.2 acid eq. per kg), neutralised with ammonia and dissolved in water | 13.4% |
| trimethylolpropanetriacrylate | 7.3% |
| Irgacure ® 907 | 1.6% |
| 4,4-bis(diethylamino)benzophenone | 0.3% |
| micronised epoxy cresol novolak ECN 1299 | 2.5% |
| water | 59% |
| Microlith ® Blue pigment | 0.06% |
| Microlith ® Yellow pigment | 0.04% |
| Byk 035 ® antifoam | 0.1% |
| talc | 10% |

Processing is carried out as described in Example 6. The adhesion to copper and the laminate of the printed circuit board in accordance with DIN 53 151 is good (GtO).

Example 9

The following composition is used:

| | |
|---|---|
| ECN 1280 solid epoxy novolak, acrylated, reacted with succinic anhydride (1.7 acid eq. per kg), neutralised with ammonia and dissolved in water | 19.3% |
| pentaerythritol triacrylate | 4.8% |
| Irgacure ® 907 | 1.2% |
| 4,4-bis(diethylamino)benzophenone | 0.2% |
| IPDI 1358 B-100 micronised oxime-capped isocyanate (deblocking at c. 120° C.) | 5.3% |
| water | 58% |
| Microlith ® Blue pigment | 0.06% |
| Microlith ® Yellow pigment | 0.04% |
| Byk 035 ® antifoam | 0.1% |
| talc | 11% |

Processing is carded out as described in Example 6. No defects occur after a subsequent solder bath.

What is claimed is:

1. A photosensitive solder resist composition which contains at least 30% by weight of water as solvent and/or dispersing medium for the components thereof and which comprises at least the following components in the indicated amounts:

10–50% by weight of water-soluble solid, crosslinkable film-forming polymers as binder selected from the group consisting of acrylic acid and methacrylic acid polymers and copolymers, and carboxyl group-containing acrylate and methacrylate polymers and copolymers, the carboxyl groups of which composition are reacted with ammonia and/or amines in an amount sufficient to ensure the water-solubility of said polymers and copolymers, the amines being chosen such that, at least at the temperatures suitable for the thermal cure of the polymers in the composition, they will substantially volatilise from a film which forms or has formed from said composition, 4–50% by weight of water-soluble and/or water-dispersible photopolymerisable acrylate and/or methacrylate monomers and/or corresponding oligomers, 0.1 to 10% by weight of water-soluble and/or water-dispersible photoinitiator compounds for the photopolymerisable acrylate and/or methacrylate monomers and/or corresponding oligomers, and, with the proviso that when the binder contains non-selfcrosslinking polymers, then the composition further comprises 2.5–40% by weight of a thermal hardener for the polymeric binder which hardener is a water-soluble and/or water-dispersible crosslinking agent for the polymeric binder, selected from the group consisting of epoxy resins, melamine resins, blocked polyisocyanates and mixtures thereof.

2. A composition according to claim 1, wherein the carboxyl groups are reacted with ammonia.

3. A composition according to claim 1, wherein the carboxyl groups are reacted with amines which are chosen such that they substantially volatilise again at least at the temperature which is applied to form a film of the photosensitive composition from the photopolymer solution.

4. A composition according to claim 1, wherein the carboxyl groups are reacted with amines which are chosen such that they substantially volatilise again at a temperature which is above the temperature which is applied to form a film of the photosensitive composition from the polymer solution.

5. A composition according to claim 1, which contains non-selfcrosslinking polymers and an epoxy resin as sole thermal hardener.

6. A composition according to claim 1, which contains non-selfcrosslinking polymers and a blocked polyisocyanate as sole thermal hardener.

7. A composition according to claim 1, which additionally contains water-compatible fillers.

8. A composition accordingly to claim 7, which comprises 10 to 35% by weight of water-compatible fillers.

9. A photosensitive solder resist composition which contains at least 30% by weight of water as solvent and/or dispersing medium for the components thereof and which comprises at least the following components in the indicated amounts:

10–50% by weight of water-soluble solid, crosslinkable film-forming polymers as binder selected from the group consisting of acrylic acid and methacrylic acid polymers and copolymers, and carboxyl group-containing acrylate and methacrylate polymers and copolymers, the carboxyl groups of which composition are reacted with ammonia and/or amines in an amount sufficient to ensure the water-solubility of said polymers and copolymers, the amines being chosen such that, at least at the temperatures suitable for the thermal cure of the polymers in the composition, they will substantially volatilise from a film which forms or has formed from said composition, 4–50% by weight of water-soluble and/or water-dispersible photopolymerisable acrylate and/or methacrylate monomers and/or corresponding oligomers, 0.1 to 10% by weight of water-soluble and/or water-dispersible photoinitiator compounds for the photopolymerisable acrylate and/or methacrylate monomers and/or corresponding oligomers, and, 2.5–40% by weight of a thermal hardener for the polymeric binder which hardener is a water-soluble and/or water-dispersible crosslinking agent for the polymeric binder, selected from the group consisting of epoxy resins, melamine resins, blocked polyisocyanates and mixtures thereof.

10. A composition according to claim 9, wherein the carboxyl groups are reacted with ammonia.

11. A composition according to claim 9, wherein the carboxyl groups are reacted with amines which are chosen such that they substantially volatilise again at least at the temperature which is applied to form a film of the photosensitive composition from the photopolymer solution.

12. A composition according to claim 9, wherein the carboxyl groups are reacted with amines which are chosen such that they substantially volatilise again at a temperature which is above the temperature which is applied to form a film of the photosensitive composition from the polymer solution.

13. A composition according to claim 9, which additionally contains water-compatible fillers.

14. A composition accordingly to claim 13, which comprises 10 to 35% by weight of water-compatible fillers.

* * * * *